(12) United States Patent
Moon et al.

(10) Patent No.: US 11,885,006 B2
(45) Date of Patent: Jan. 30, 2024

(54) MASK, METHOD OF PROVIDING THE SAME, AND METHOD OF PROVIDING DISPLAY PANEL USING MASK

(71) Applicant: Samsung Display Co., Ltd., Yongin-si (KR)

(72) Inventors: Youngmin Moon, Yongin-si (KR);
Minho Moon, Seongnam-si (KR);
Seungyong Song, Suwon-si (KR);
Sungsoon Im, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/158,679

(22) Filed: Jan. 24, 2023

(65) Prior Publication Data
US 2023/0160054 A1 May 25, 2023

Related U.S. Application Data

(62) Division of application No. 17/324,029, filed on May 18, 2021, now Pat. No. 11,618,941.

(30) Foreign Application Priority Data

Aug. 31, 2020 (KR) .................. 10-2020-0110613

(51) Int. Cl.
*C23C 14/04* (2006.01)
*B05C 21/00* (2006.01)
(Continued)

(52) U.S. Cl.
CPC .......... *C23C 14/042* (2013.01); *B05C 21/005* (2013.01); *H10K 71/00* (2023.02); *H10K 71/166* (2023.02)

(58) Field of Classification Search
None
See application file for complete search history.

(56) References Cited

U.S. PATENT DOCUMENTS

| 8,151,729 B2 | 4/2012 | Ko ......................... B23K 31/02 |
| | | 118/301 |
| 8,286,579 B2 | 10/2012 | Sung ..................... C23C 14/042 |
| | | 118/301 |

(Continued)

FOREIGN PATENT DOCUMENTS

| KR | 10-0700839 B1 | 3/2007 |
| KR | 10-0922046 B1 | 10/2009 |

(Continued)

OTHER PUBLICATIONS

European Search Report for European Patent Application No. 21192929.4 dated Jan. 26, 2022.

*Primary Examiner* — Jethro M. Pence
(74) *Attorney, Agent, or Firm* — CANTOR COLBURN LLP

(57) ABSTRACT

A mask assembly includes a mask frame in which a first opening is defined, the mask frame including a front surface through which the first opening extends, and a deposition mask which is attached to the front surface of the mask frame and through which a plurality of second openings is defined. The mask frame includes an in which the front surface extends along a direction of gravity, the deposition mask includes an initial mask which is attached to the front surface of the mask frame in the thereof and through which the plurality of second openings is defined, and the of the mask frame having the front surface which extends along the direction of gravity disposes the first opening of the mask frame corresponding to all of the plurality of second openings of the initial mask along the direction of gravity.

6 Claims, 17 Drawing Sheets

(51) Int. Cl.
*H10K 71/00* (2023.01)
*H10K 71/16* (2023.01)

(56) References Cited

U.S. PATENT DOCUMENTS

| | | | |
|---|---|---|---|
| 8,459,526 B2 | 6/2013 | Hong et al. | |
| 8,646,406 B2 | 2/2014 | Ahn | H01L 51/0011 118/301 |
| 8,656,859 B2 | 2/2014 | Hong | H01L 51/0011 118/504 |
| 8,757,088 B2 | 6/2014 | Lee | C23C 14/04 118/504 |
| 8,881,676 B2 * | 11/2014 | Hong | H10K 71/00 118/504 |
| 8,915,213 B2 | 12/2014 | Park | C23C 14/12 118/721 |
| 9,162,243 B2 * | 10/2015 | Pei | B05C 13/02 |
| 9,192,959 B2 * | 11/2015 | Hong | C23F 1/02 |
| 9,289,798 B2 | 3/2016 | Park | C23C 14/042 |
| 9,500,962 B2 | 11/2016 | Kim | |
| 9,583,708 B2 | 2/2017 | Ko | C23C 14/042 |
| 9,604,240 B2 | 3/2017 | Ko | B05B 12/29 |
| 9,657,392 B2 | 5/2017 | Han | B05C 21/005 |
| 9,666,837 B2 | 5/2017 | Lee | H01L 51/56 |
| 9,711,724 B2 | 7/2017 | Baek | H01L 51/0011 |
| 9,821,416 B2 | 11/2017 | Kim | B23K 37/0408 |
| 9,931,666 B2 | 4/2018 | Ahn | B05C 21/005 |
| 9,956,580 B2 * | 5/2018 | Strock | B05C 21/005 |
| 10,014,471 B2 * | 7/2018 | Baek | C23F 1/02 |
| 10,083,997 B2 | 9/2018 | Kim | H01L 51/0011 |
| 10,406,555 B2 * | 9/2019 | Strock | B05B 12/20 |
| 10,439,170 B2 * | 10/2019 | Lin | C23C 14/042 |
| 10,533,246 B2 * | 1/2020 | Mizumura | C25D 3/12 |
| 10,625,289 B2 | 4/2020 | Gong | C23C 14/042 |
| 10,737,289 B2 | 8/2020 | Kang | C23C 14/042 |
| 10,982,314 B2 | 4/2021 | Lin | B05D 1/32 |
| 11,203,808 B2 * | 12/2021 | Zhu | C23C 14/12 |
| 11,207,705 B2 | 12/2021 | Gong | B23K 31/02 |
| 11,214,858 B2 | 1/2022 | Jin | C23C 14/042 |
| 11,309,518 B2 * | 4/2022 | Du | H10K 50/8445 |
| 11,319,625 B2 * | 5/2022 | Luo | H01L 23/544 |
| 11,616,198 B2 * | 3/2023 | Kim | H10K 71/164 118/504 |
| 11,618,941 B2 * | 4/2023 | Moon | H10K 71/166 118/504 |
| 2002/0102754 A1 | 8/2002 | Fujimori | H01L 51/0011 438/22 |
| 2011/0171768 A1 | 7/2011 | Hong | C23C 14/042 257/E33.001 |
| 2011/0220019 A1 | 9/2011 | Lee | C23C 14/042 118/504 |
| 2013/0298826 A1 | 11/2013 | Park | C23C 14/042 118/504 |
| 2014/0130735 A1 | 5/2014 | Kim | C23C 14/042 118/504 |
| 2014/0137798 A1 | 5/2014 | Ahn | B05C 21/005 118/504 |
| 2014/0158044 A1 | 6/2014 | Han | C23C 14/042 118/504 |
| 2014/0331926 A1 | 11/2014 | Kim | C23C 14/042 118/504 |
| 2015/0007767 A1 | 1/2015 | Ko | B05B 12/29 118/504 |
| 2015/0007768 A1 | 1/2015 | Lee | C23C 14/042 118/504 |
| 2015/0034005 A1 | 2/2015 | Ko | H01L 51/0011 118/504 |
| 2015/0047560 A1 | 2/2015 | Kang | H01L 27/3223 118/504 |
| 2015/0165464 A1 | 6/2015 | Baek | C23C 14/042 118/504 |
| 2016/0079568 A1 | 3/2016 | Han | C23C 18/31 438/34 |
| 2016/0312354 A1 | 10/2016 | Ko et al. | |
| 2019/0003033 A1 | 1/2019 | Bai | C23C 14/042 |
| 2019/0078193 A1 | 3/2019 | Lin | C23C 14/042 |
| 2019/0368025 A1 | 12/2019 | Kim | |
| 2020/0083453 A1 | 3/2020 | Zang et al. | |
| 2021/0343760 A1 * | 11/2021 | Jo | H01L 27/1288 |
| 2022/0020926 A1 | 1/2022 | Kim | H01L 51/56 |

FOREIGN PATENT DOCUMENTS

| | | |
|---|---|---|
| KR | 10-0947442 B1 | 3/2010 |
| KR | 10-1307153 B1 | 9/2013 |
| KR | 1020180087824 A | 8/2018 |
| KR | 1020180113675 A | 10/2018 |
| KR | 1020200017217 A | 2/2020 |

\* cited by examiner

MASK, METHOD OF PROVIDING THE SAME, AND METHOD OF PROVIDING DISPLAY PANEL USING MASK

This application a divisional application of U.S. application Ser. No. 17/324,029 filed May 18, 2021, which claims priority to Korean Patent Application No. 10-2020-0110613, filed on Aug. 31, 2020, and all the benefits accruing therefrom under 35 U.S.C. § 119, the entire contents of which are hereby incorporated by reference.

BACKGROUND

(1) Field

The disclosure herein relates to a deposition mask, a method of providing (or manufacturing) the same, and a method of providing (or manufacturing) a display panel using the deposition mask. More particularly, the disclosure herein relates to a metal deposition mask, a method of providing the same, and a method of providing a display panel by using the metal deposition mask.

(2) Description of the Related Art

A display panel includes a plurality of pixels. Each of the pixels includes a driving element such as a transistor and a display element such as an organic light-emitting diode. The display element may be disposed by stacking an electrode and a light-emitting pattern on a substrate.

The light-emitting pattern is patterned by using a deposition mask having a penetration hole (e.g., deposition hole) defined therein so as to be disposed in a region of the deposition mask. The light-emitting pattern may be provided to a target in a region thereof exposed to outside the deposition mask by the penetration hole thereof.

SUMMARY

The disclosure provides a mask used to manufacture a large-area display panel and a method of manufacturing the mask which may improve reliability and reduce costs.

An embodiment provides a mask including a mask frame having a first opening defined therein and a deposition mask having a plurality of second openings defined therein, where the first opening overlaps all of the second openings.

In an embodiment, the deposition mask may be provided in plurality, and the plurality of deposition masks may overlap the first opening.

In an embodiment, the first opening may be provided in plurality, the deposition mask may be provided in plurality, and the deposition masks may be disposed respectively corresponding to the first openings.

In an embodiment, the mask may further include a middle frame between the mask frame and the deposition mask. The middle frame may include a plurality of third openings and the first opening may overlap all of the third openings.

In an embodiment, the second openings may overlap one of the third openings.

In an embodiment, the deposition mask and the mask frame may include metal.

In an embodiment, a method of manufacturing a mask includes providing a mask frame having a first opening defined therein, providing an initial deposition mask having a plurality of second openings defined therein which overlap the first opening on the front surface of the mask frame, combining the initial deposition mask with the mask frame to provide a mask assembly, and removing a portion of the initial deposition mask to form the mask from the mask assembly. At the providing of the initial deposition mask, the initial deposition mask is attached to a porous chuck and provided on the front surface of the mask frame.

In an embodiment, the front surface of the mask frame may be provided in parallel with the direction of gravity.

In an embodiment, the porous chuck may be provided in plurality.

In an embodiment, the portion of the initial deposition mask may be removed by using a pulse laser.

In an embodiment, a region in which the pulse laser is provided may be between the second openings and the porous chuck.

In an embodiment, the region in which the pulse laser is provided may be between the porous chuck and the region in which the initial deposition mask and the mask frame are combined.

The method of manufacturing the mask may further include providing a middle frame between the mask frame and the initial deposition mask, and the initial deposition mask may be provided on the front surface of the middle frame and combined with the middle frame.

In an embodiment, the porous chuck may be combined with the removed portion of the initial deposition mask.

In an embodiment, a method of manufacturing a display panel includes providing a mask on a work substrate and forming a plurality of light-emitting patterns on the work substrate with a deposition material. The mask includes a mask frame having a first opening defined therein and a deposition mask having a plurality of second openings defined therein, respectively corresponding to the light-emitting patterns, where the first opening overlaps all of the second openings.

In an embodiment, the first opening may have an area corresponding to the work substrate.

In an embodiment, the method may further include cutting the work substrate into a plurality of display panels after the forming of the light-emitting patterns. The first opening is provided in plurality, the plurality of first openings correspond to the display panels, respectively, and the work substrate may entirely overlap the first openings.

In an embodiment, the method may further include providing a middle frame between the frame and the deposition mask and having a plurality of third openings defined therein, and combining the deposition mask with the middle frame. One of the third openings may overlap the second openings, and the first opening may overlap the third openings.

In an embodiment, at least one of the deposition mask and the mask frame may be melted, and the deposition mask and the mask frame may be combined.

In an embodiment, the first opening may have a single closed loop shape on a plane.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the invention. In the drawings.

DETAILED DESCRIPTION

Figure 1:
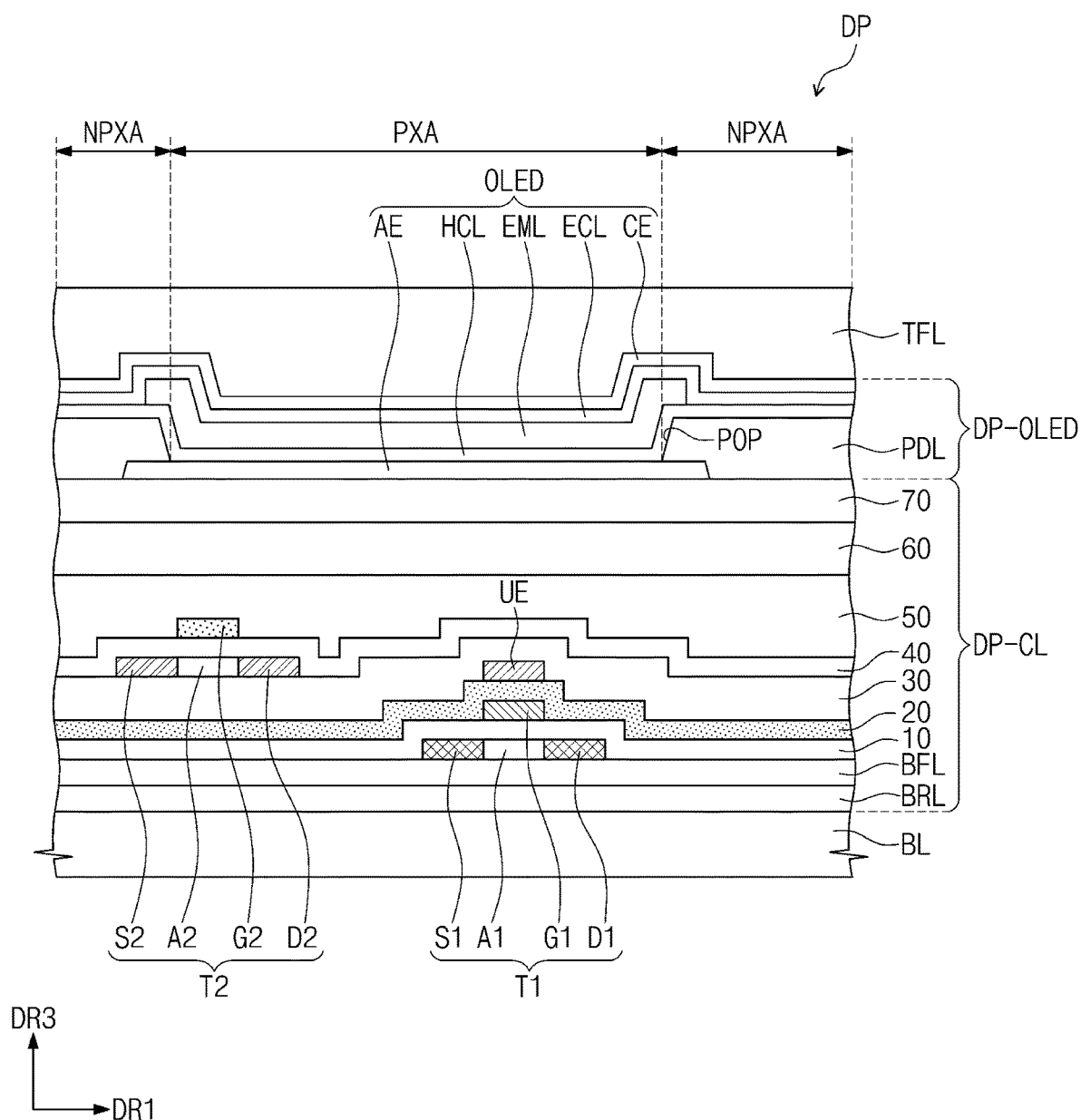
FIG. 1 is a cross-sectional view of an embodiment of a display panel.

Hereinafter, embodiments of the invention will be described in detail with reference to the accompanying drawings.

It will be understood that when an element (area, layer, portion, or the like) is referred to as being related to another element such as being "on," "connected to" or "coupled to" another element, it can be directly on, connected or coupled to the other element or intervening elements may be present. In contrast, when an element (area, layer, portion, or the like) is referred to as being related to another element such as being "directly on," "directly connected to" or "directly coupled to" another element, no other element or intervening elements are present.

Like reference numerals refer to like elements throughout. The thicknesses and the ratios and the dimensions of elements in the drawings may be exaggerated for effective description of the technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. For example, a first element, component, region, layer or section discussed below could be termed a second element, component, region, layer or section without departing from the teachings of the inventive concept. Similarly, a second element, component, region, layer or section could be termed a first element, component, region, layer or section.

Spatially relative terms, such as "below," "lower," "above," "upper" and the like, may be used herein for ease of description to describe one element or feature's relationship to another element(s) or feature(s) as illustrated in the figures. The terms used herein are relative concepts and described on the basis of directions in the drawings.

It will be further understood that the terms "include" or "have", when used in this specification, specify the presence of stated features, integers, steps, operations, elements, components and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10% or ±5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims A shape of a light-emitting pattern of a display panel may be controlled depending on the shape of a penetration hole (e.g., deposition opening) of a deposition mask. In order to increase the production yield of a display panel including the light-emitting pattern, technologies related to facilities and methods of providing (or manufacturing) a large-area deposition mask are being developed.

Hereinafter, the invention will be described in detail with reference to the accompanying drawings.

FIG. 1 is a cross-sectional view of an embodiment of a display panel DP. The display panel DP may be a light-emitting display panel. FIG. 1 illustrates a cross section corresponding to one pixel among a plurality of pixels of the display panel DP. In this specification, a pixel includes at least one transistor and one display element such as one light-emitting element. FIG. 1 illustrates, as an example, a region in which two transistors T1 and T2 and a light-emitting diode OLED as a light-emitting element are disposed in a pixel.

As illustrated in FIG. 1 the display panel DP includes a base layer BL, a circuit element layer DP-CL disposed on the base layer BL, a display element layer DP-OLED disposed on the circuit element layer DP-CL, and an upper insulating layer TFL (e.g., encapsulation layer) disposed on the display element layer DP-OLED.

The base layer BL may include a synthetic resin layer. In an embodiment of providing the display panel DP, the synthetic resin layer is disposed on a support substrate, and then a conductive material layer and an insulating material layer are disposed on the synthetic resin layer. In providing the display panel DP, when the support substrate is removed from a remainder of the layers, the synthetic resin layer corresponds to the base layer BL of the display panel DP.

The circuit element layer DP-CL includes at least one insulating material layer and one circuit element. The circuit element includes a signal line, a pixel driving circuit, and the like. Through a process of providing or forming an insulating material layer, a semiconductor material layer and a conductive material layer using coating, depositing and the like, and a process of patterning the insulating material layer, the semiconductor material layer and the conductive material layer using a photolithography process, a circuit element layer DP-CL may be provided or formed.

In an embodiment, the circuit element layer DP-CL includes a buffer layer BFL, a barrier layer BRL, and first to seventh insulating layers 10 to 70. The buffer layer BFL, the barrier layer BRL and the first to seventh insulating layers 10 to 70 may include either an inorganic material film or an organic material film. The buffer layer BFL and the barrier layer BRL may include an inorganic material film. At least one among the fifth to seventh insulating layers 50 to 70 may include an organic material film.

FIG. 1 illustrates, as an example, an arrangement relation of a first active A1, a second active A2, a first gate G1, a second gate G2, a first source S1, a second source S2, a first drain D1 and a second drain D2 which constitute a first transistor T1 and a second transistor T2. In an embodiment, the first active A1 and the second active A2 may include different materials. The first active A1 may include a polysilicon semiconductor material, and the second active A2 may include a metal oxide semiconductor material. The first source S1 and the first drain D1 are regions having a higher doping concentration than the first active A1, and have a conductive property to function as electrodes. The second source S2 and the second drain D2 are regions in which the metal oxide semiconductor material is reduced, and have a conductive property to function as electrodes.

In an embodiment, the first active A1 and the second active A2 may include a same semiconductor material, and in this case, a stacked structure of the circuit element layer DP-CL may be simplified.

The display element layer DP-OLED includes a pixel-defining film PDL and a light-emitting diode OLED. The light-emitting diode OLED may be an organic light-emitting diode or a quantum dot light-emitting diode. An anode AE is disposed on the seventh insulating layer 70. A pixel opening POP of the pixel-defining film PDL may expose at least a portion of the anode AE to outside the pixel-defining film PDL. The pixel opening POP of the pixel-defining film PDL may define a light-emitting region PXA of the pixel. A non-light-emitting region NPXA of the pixel may be adjacent to the light-emitting region PXA. In an embodiment, the non-light-emitting region NPXA may surround the light-emitting region PXA in a plan view of the display panel DP.

A hole control layer HCL and an electron control layer ECL may be disposed in common corresponding to both the light-emitting region PXA and the non-light-emitting region NPXA. A light-emitting layer EML may be provided in the form of a pattern so as to correspond to the pixel opening POP. A cathode CE may be disposed in common corresponding to both the light-emitting region PXA and the non-light-emitting region NPXA.

The light-emitting layer EML which is a discrete pattern may be provided in a different process than the hole control layer HCL and the electron control layer ECL which are each a film. In order to provide the light-emitting layer EML as a discrete pattern having a shape, a mask assembly may be used. A discrete pattern provided by using the mask assembly may be referred to as a deposition pattern.

The hole control layer HCL and the electron control layer ECL may be disposed in common in a plurality of pixels by using an open deposition mask. The light-emitting layer EML as a deposition pattern may be disposed according to positions along the base layer BL which correspond to pixels by using a deposition mask otherwise referred to herein as a fine metal mask ("FMM").

The upper insulating layer TFL may include a plurality of thin films. The plurality of thin films may include an inorganic material film and an organic material film. The upper insulating layer TFL may include an insulating material layer for encapsulating the display element layer DP-OLED and an insulating material layer for improving light output efficiency.

Figure 2:
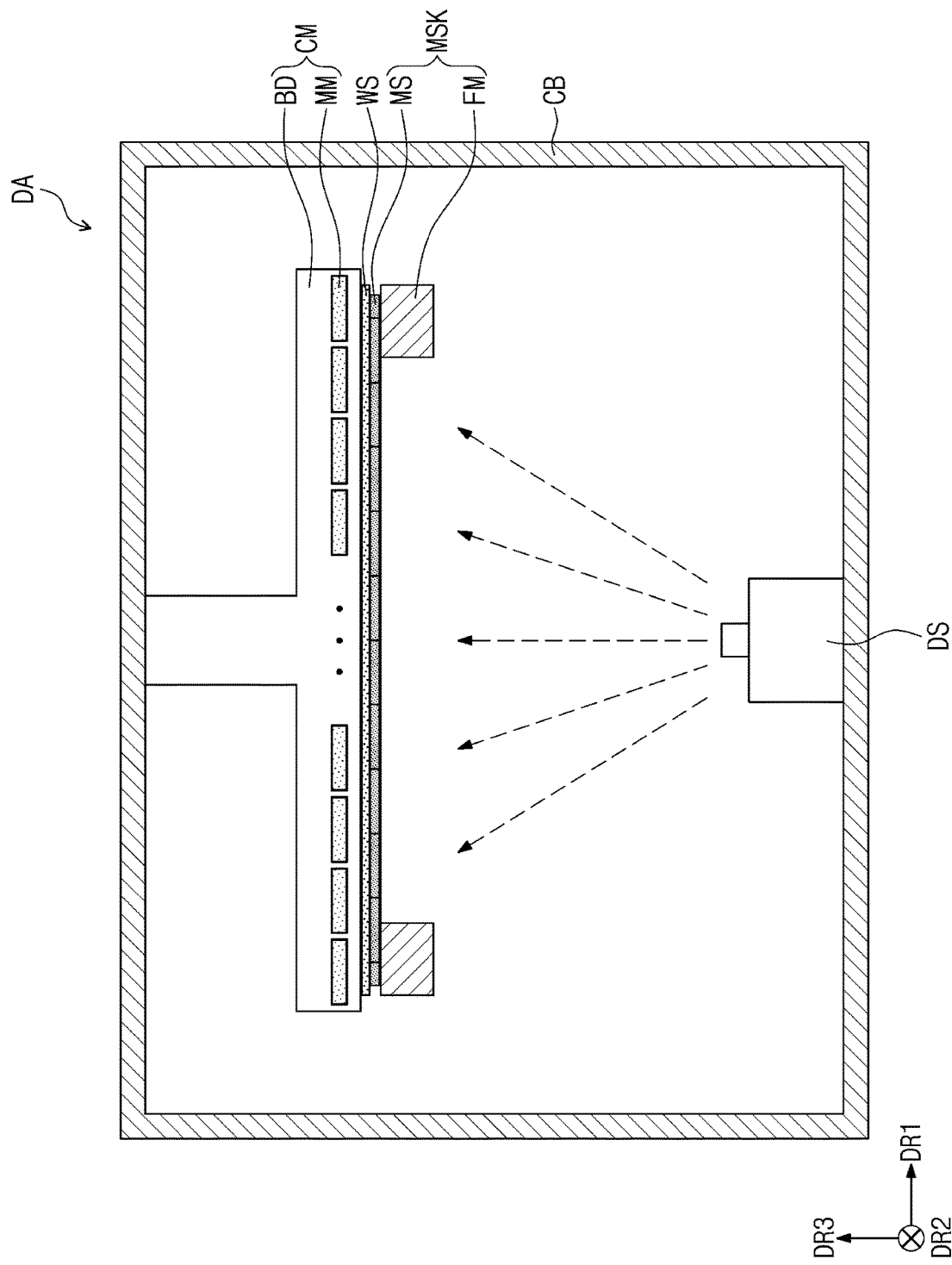
FIG. 2 is a cross-sectional view of an embodiment of a deposition apparatus.

FIG. 2 is a cross-sectional view of an embodiment of a deposition apparatus DA. The deposition apparatus DA may be used for a deposition process in providing of the display panel DP in FIG. 1, particularly for providing of the light-emitting layer EML as a deposition pattern in the deposition process.

As illustrated in FIG. 2, the deposition apparatus DA includes a deposition chamber CB, a fixing member CM, a deposition source DS (e.g., deposition material source) disposed inside the deposition chamber CB, and a mask MSK (hereinafter referred to as a mask assembly) disposed inside the deposition chamber CB. Although not illustrated separately, the deposition apparatus DA may further include an additional mechanical device for implementing an in-line system.

The deposition condition of the deposition chamber CB may be set to a vacuum state. The deposition chamber CB may include a floor surface, a ceiling surface and side walls which connect the floor surface to the ceiling surface. The floor surface of the deposition chamber CB is in a plane parallel to a plane defined by a first direction axis DR1 (e.g., first direction D1 (see FIG. 3A)) and a second direction axis DR2 (e.g. second direction D2 (see FIG. 3A)) which cross each other. A third direction axis DR3 (e.g., third direction D3 (see FIG. 3A)) indicates a direction normal to the floor surface of the deposition chamber CB. Hereinafter, the first to third directions D1, D2 and D3 are defined as directions indicated by each of the first to third direction axes DR1, DR2 and DR3, and refer to like reference numerals. The expression "on a plane" used hereinafter is set on the basis of a surface parallel to the plane defined by the first direction axis DR1 and the second direction axis DR2 which cross each other. The expression "in a plan view" used herein indicates viewing along a third direction D3. The thickness direction of components or layers may be defined along the third direction D3, without being limited thereto.

The fixing member CM is disposed inside the deposition chamber CB and facing the deposition source DS, and fixes a position of the mask MSK within the deposition chamber CB. The fixing member CM may be installed to the ceiling surface. The fixing member CM may include a jig and/or a robot arm which holds the mask MSK to fix a position or location thereof within the deposition chamber CB.

The fixing member CM includes a body portion BD and a magnetic portion which is coupled to the body portion BD. The magnetic portion may include a magnetic material MM (e.g., magnetic material portion) provided in plural including magnetic materials MM coupled to the body portion BD. The body portion BD may include a plate as a basic structure for fixing the mask MSK to the fixing member CM, but is not limited thereto. The magnetic materials MM may be disposed inside and/or outside the body portion BD. The magnetic materials MM may fix the mask MSK to the fixing member CM by magnetic force.

The deposition source DS may evaporate a deposition material such as a light-emitting material and discharge the deposition material as deposition vapor. The deposition vapor passes through penetration holes defined in the mask MSK and is deposited onto a work substrate WS (e.g., target substrate) in a pattern to provide a deposition pattern on the work substrate WS.

The mask MSK is disposed inside the deposition chamber CB and facing the deposition source DS. The mask MSK which faces the work substrate WS may support the work substrate WS within the deposition chamber CB. The work substrate WS may include a glass substrate or a plastic substrate. The work substrate WS may include a polymer layer disposed on a base substrate. In a process of providing the display panel, the base substrate may be removed and the polymer layer of the work substrate WS may correspond to the base layer BL within the display panel DP of FIG. 1.

The mask MSK includes a deposition mask (hereinafter referred to as a unit mask MS) and a mask frame FM. The unit mask MS may be provided in plurality including a plurality of unit masks MS, and each of the unit masks MS may correspond to a deposition mask for cell-based deposition. The unit mask MS is provided in combination with the mask frame FM. A detailed description of this will be given later.

Figure 3A:
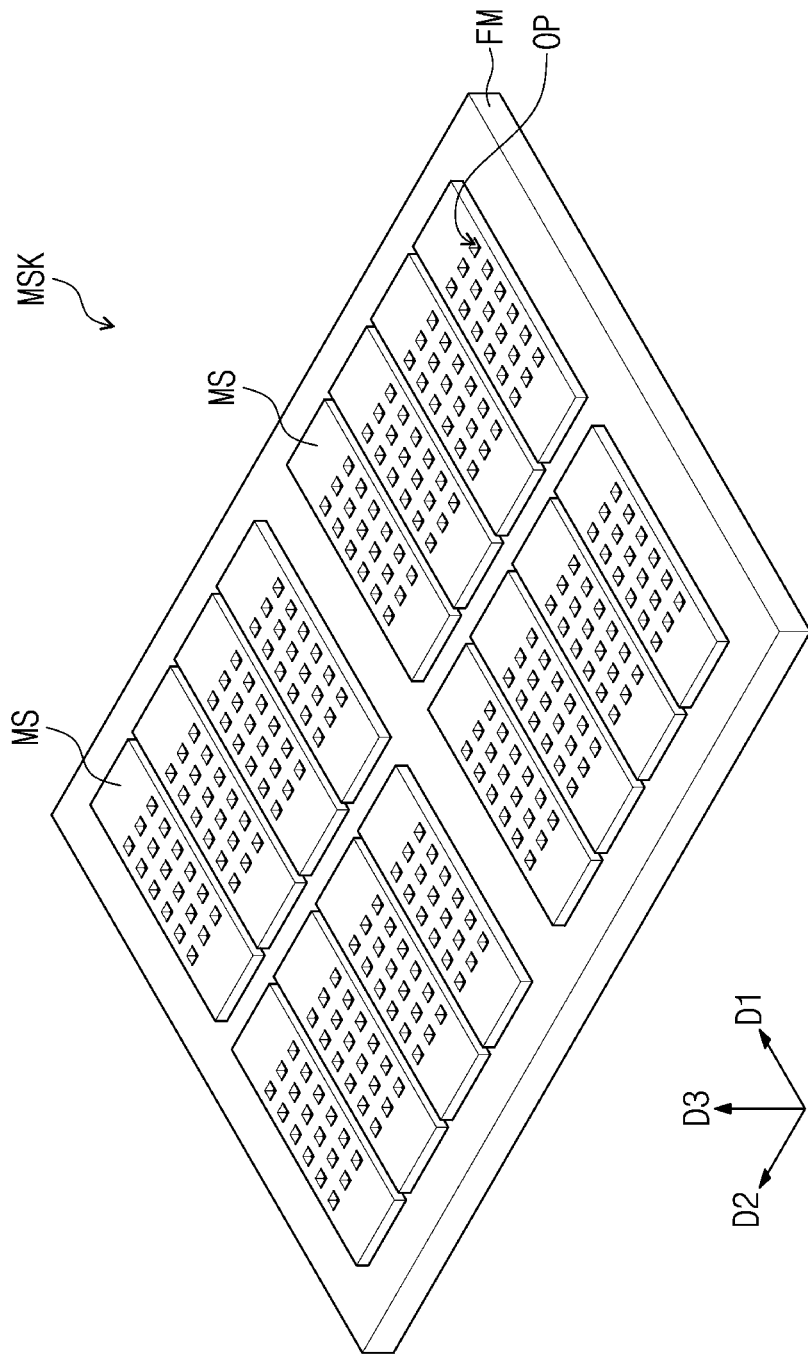
FIGS. 3A and 3B are perspective views of an embodiment of a mask.
Figure 3B:
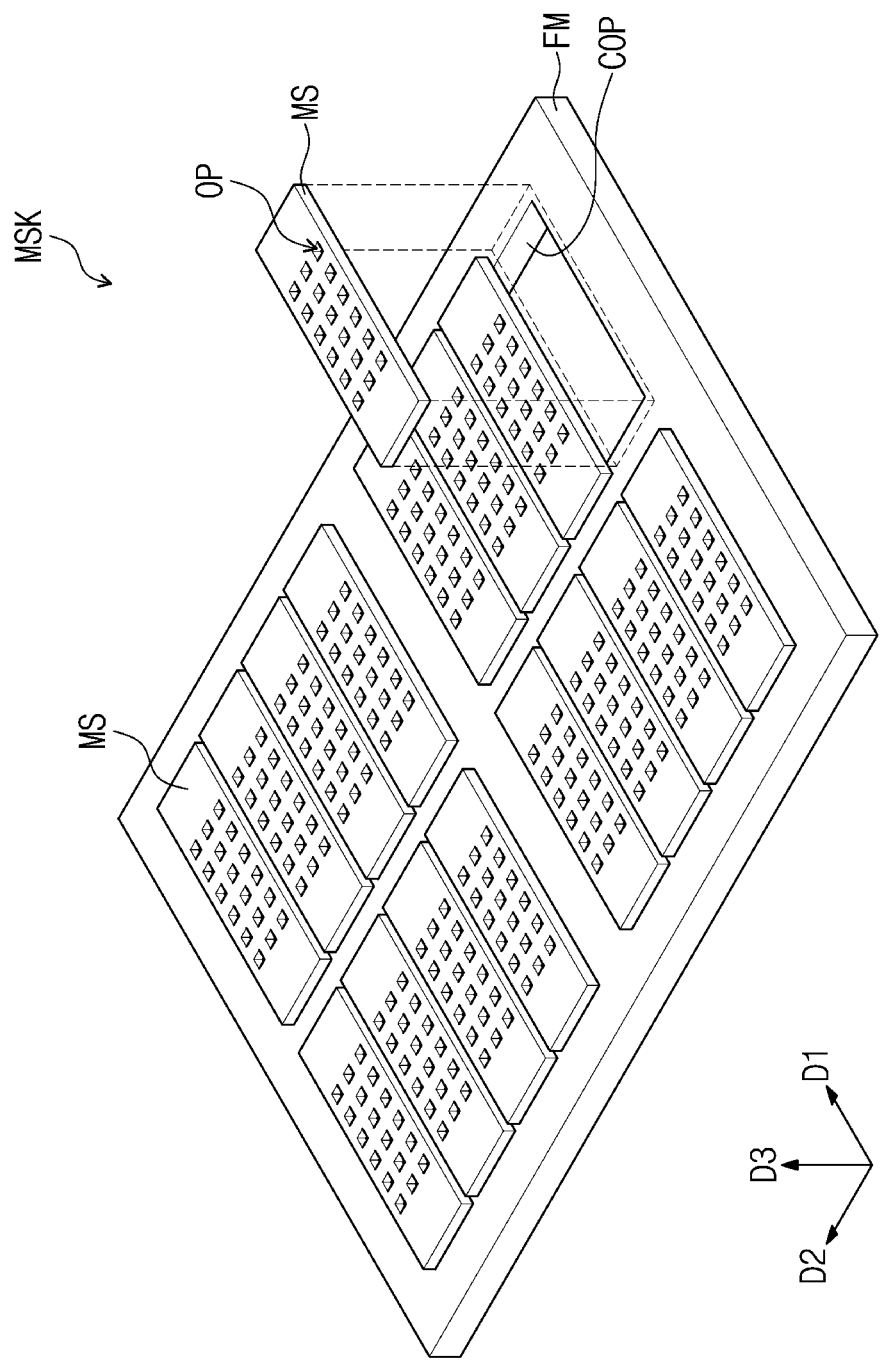
Figure 4:
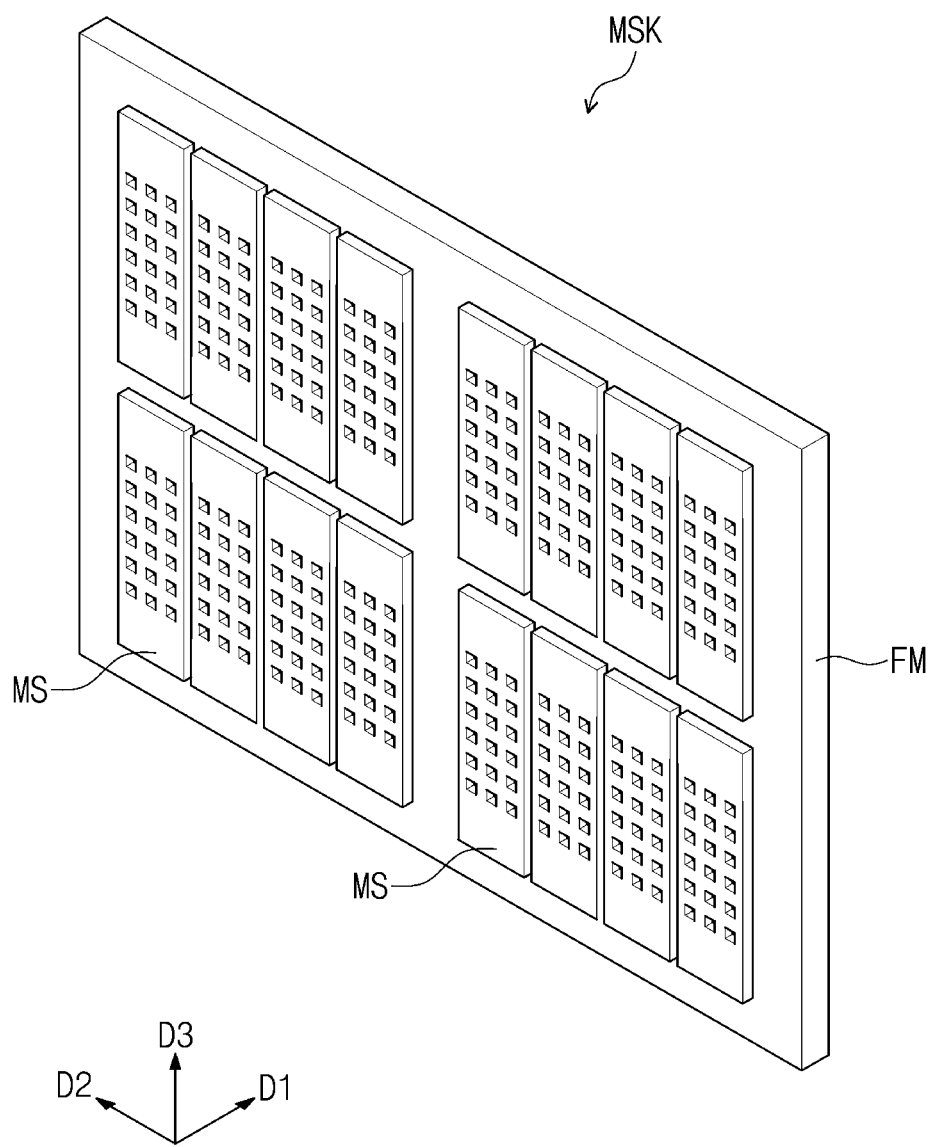
FIG. 4 is a perspective view of an embodiment of a mask.

FIGS. 3A and 3B are perspective views of an embodiment of a mask assembly. FIG. 4 is a perspective view of an embodiment of a mask assembly. FIG. 3A illustrates a mask MSK which is horizontal and FIG. 3B illustrates an embodiment in which a unit mask MS is separated from the mask frame FM. FIG. 4 illustrates a mask MSK which is upright.

As illustrated in FIG. 3A, the mask MSK includes a mask frame FM and a plurality of unit masks MS. The mask frame FM may have a rectangular shape with short sides extending along a first direction D1 and long sides extending along a second direction D2 intersecting each other. The mask frame FM has a thickness defined along a third direction D3 which intersects each of the first direction D1 and the second direction D2. The third direction D3 indicates a direction which substantially and vertically crosses a plane defined by the first and second directions D1 and D2 intersecting each other. Hereinafter, the expression "in a plan view" in this specification may mean viewing along the third direction D3.

Portions of the mask frame FM may define a cell opening COP (e.g., first opening or first deposition opening). The cell opening COP may be provided in plural including a plurality of cell openings COP defined in the mask frame FM. The cell openings COP may be arranged spaced apart from each other along at least one of the first direction D1 and the second direction D2. The cell openings COP may have a matrix arrangement along the first direction D1 and the second direction D2.

On a plane, each of the cell openings COP may have a rectangular shape. In an embodiment, for example, the cell opening COP may have two long sides spaced apart along the first direction D1 and extending along the second direction D2. The cell opening COP may have two short sides spaced apart along the second direction D2 and extending along the first direction D1. On the basis of the third direction D3, the cell openings COP may be defined to pass through the mask frame FM. That is, each of the cell openings COP may extend through an entirety of a thickness of the mask frame FM.

The plurality of unit masks MS are disposed on the mask frame FM. The unit masks MS are disposed to non-overlap each other on a plane. That is, the unit masks MS may be adjacent to each other along the mask frame FM. The unit masks MS may be disposed corresponding to a number of the cell openings COP. In an embodiment, four of the unit masks MS are exemplarily illustrated to corresponding to a single one among the cell openings COP.

Portions of the unit mask MS may define an opening OP (e.g., second opening or second deposition opening) provided in plural including a plurality of openings OP (e.g., deposition openings) corresponding to the cell opening COP. Solid portions of the unit mask MS may be spaced apart from each other to define the openings OP. The opening OP may substantially correspond to a deposition pattern such as the light-emitting layer EML (see FIG. 1). A deposition material may be deposited as a light-emitting layer EML onto the work substrate WS through the opening OP.

A unit mask MS is disposed to overlap one of the cell openings COP and a corresponding periphery of the cell opening COP of the mask frame FM. The unit mask MS may be combined with the mask frame FM at the periphery of the cell opening COP. A detailed description of this will be given later.

Each of the unit masks MS may be a thin plate having a small thickness when compared with a thickness of the mask frame FM. Each of the unit masks MS and the mask frame FM may include a metal material such as stainless steel ("SUS"), Invar alloy, nickel (Ni) or cobalt (Co). In an embodiment, for example, the unit mask MS and the mask frame FM may include Invar alloy. However, the materials of the unit mask MS and the mask frame FM are not limited thereto.

The mask MSK may be provided in an upright state. As illustrated in FIG. 4, the mask MSK may be provided in an upright state so that a short side of the mask MSK is parallel to the third direction D3 (e.g., a direction of gravity). The mask MSK which is upright disposes a front surface SF (see FIG. 5A) of the mask frame FM to which the unit mask MS is attached extended along the third direction D3.

The mask MSK illustrated in FIG. 4 may be an orientation of the mask MSK in both a process of providing the mask MSK (see FIG. 5B) and a time immediately after the providing of the mask MSK. In an embodiment of providing an initial mask assembly MSA, the mask MSK may be moved or stored in the orientation illustrated in FIG. 4. Taking FIGS. 3A and 3B together with FIG. 4, an attachment orientation of the mask frame FM having a front surface SF which extends along the direction of gravity disposes the plurality of first openings (e.g., cell openings COP) of the mask frame FM respectively corresponding to the plurality of deposition masks (e.g., unit masks MS) along the direction of gravity.

In one or more embodiment of the invention, by orienting the mask MSK to be upright (e.g., in an upright state or vertical state) in moving or storing of the mask MSK, deformation of the mask MSK which may be caused by gravity during moving or storing of the initial mask assembly MSA may be reduced or effectively prevented. Accordingly, the reliability of a process in which the mask MSK is provided may be improved.

An embodiment of a method of providing a display panel DP may include providing a mask assembly on a target substrate, and providing a light-emitting pattern of the display panel DP on the target substrate through the mask assembly. The method may further include providing the light-emitting pattern in plural including a plurality of light-emitting patterns of a plurality of display panels respectively at target areas of the target substrate, and providing the plurality of display panels separated from each other. The mask assembly may further include a first opening provided in plural including a plurality of first openings corresponding to the plurality of display panels, respectively. An attachment orientation of the mask frame FM having the front surface SF which extends along the direction of gravity disposes the plurality of first openings of the mask frame FM respectively corresponding to the target areas of the target substrate along the direction of gravity.

FIGS. 5A to 5F illustrate an embodiment of a method of providing (or manufacturing) an initial mask assembly MSA. FIGS. 5A to 5F illustrate cross-sectional views of the initial mask assembly MSA which is in an upright orientation, taken along a third direction D3 on the basis of a single one of the cell opening COP and a single one of the unit mask MS illustrated in FIG. 4.

Figure 5A:
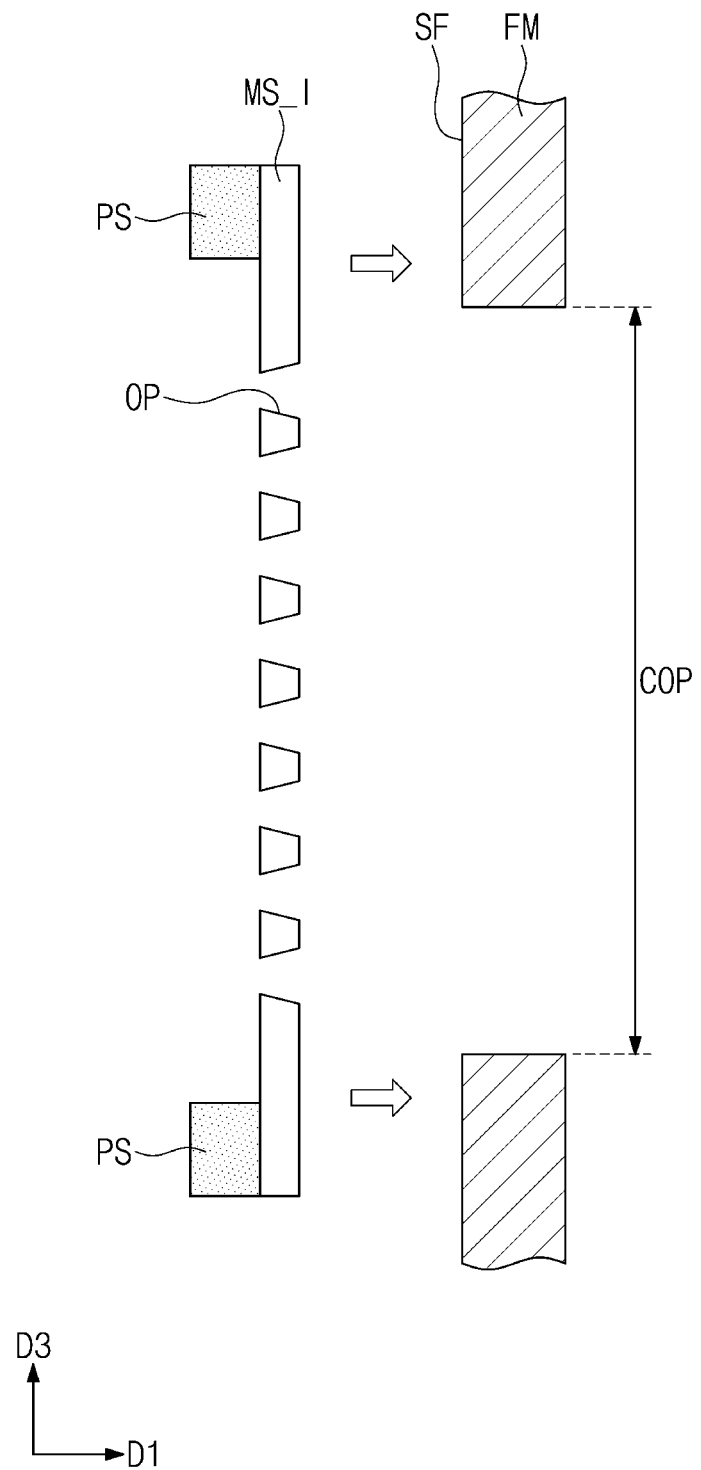
FIGS. 5A to 5F illustrate an embodiment of a method of manufacturing a mask.

As illustrated in FIG. 5A, an initial unit mask MS_I (otherwise referred to as an initial mask or initial deposition mask) includes openings OP corresponding to the openings OP of the unit mask MS. The initial unit mask MS_I is provided on a mask frame FM such as by movement of the initial unit mask MS_I in the direction of the arrow. The initial unit mask MS_I may be moved by a porous chuck PS (e.g., holding tool). A planar area of the mask frame FM may be larger than a planar area of the initial unit mask MS_I, especially for a dimension along the third direction D3. In an embodiment, for example, the initial unit mask MS_I may have a length along the third direction D3 which is greater than a length of the unit mask MS in an upright orientation.

The porous chuck PS having the initial unit mask MS_I attached thereto, moves the initial unit mask MS_I toward a front surface SF of the mask frame FM. The porous chuck PS may be a vacuum chuck. The initial unit mask MS_I which is in a vertical orientation may be easily moved by using the porous chuck PS. That is, the providing of the initial mask assembly MSA may include providing the initial deposition mask attached to a holding tool (e.g., porous chuck PS) which maintains the initial deposition mask parallel to the front surface SF of the mask frame FM which extends along the direction of gravity. In an embodiment, the initial deposition mask is attached to a plurality of holding tools at opposing sides of the first opening of the mask frame FM which maintain the initial deposition mask parallel to the front surface SF of the mask frame FM which extends along the direction of gravity.

Figure 5B:
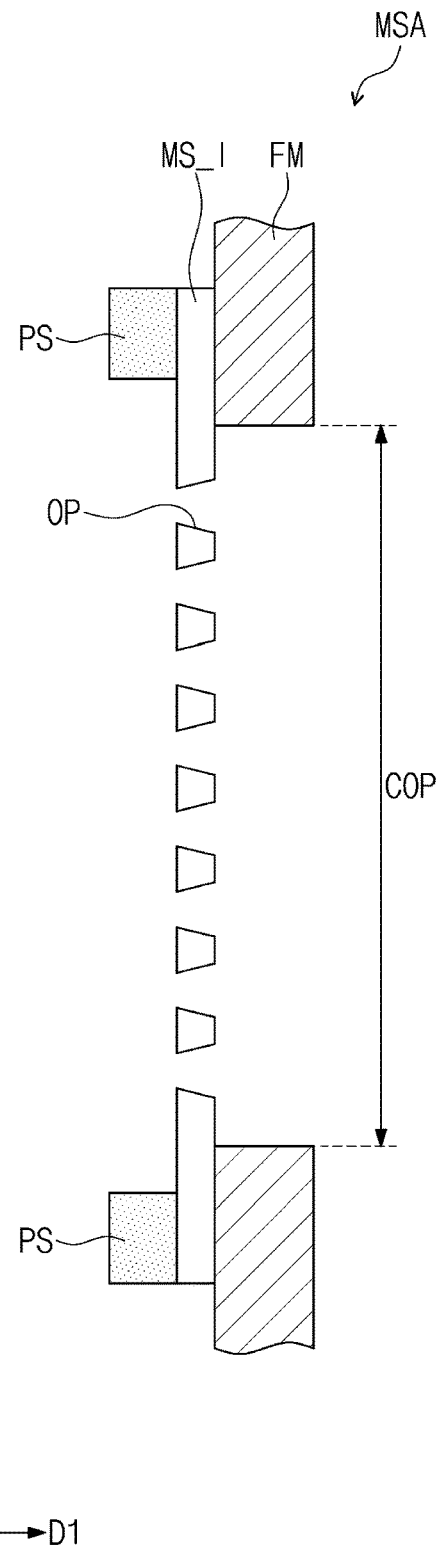

As illustrated in FIGS. 5A and 5B, the initial unit mask MS_I is moved by the porous chuck PS and is contacted with the front surface SF of the mask frame FM. The initial unit mask MS_I in contact with the mask frame FM remains attached to the porous chuck PS. Therefore, sliding of the initial unit mask MS_I by gravity (in the direction opposite to the third direction D3) is reduced or effectively prevented.

Figure 5C:
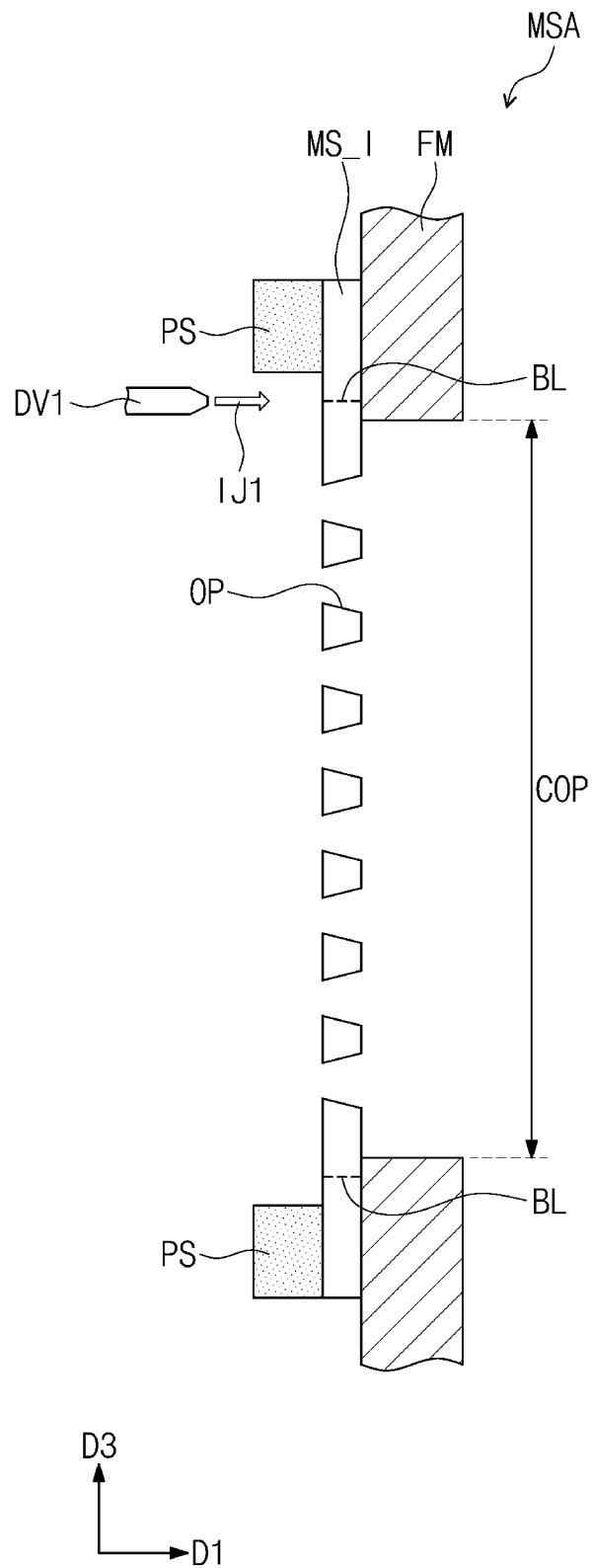
Figure 5D:
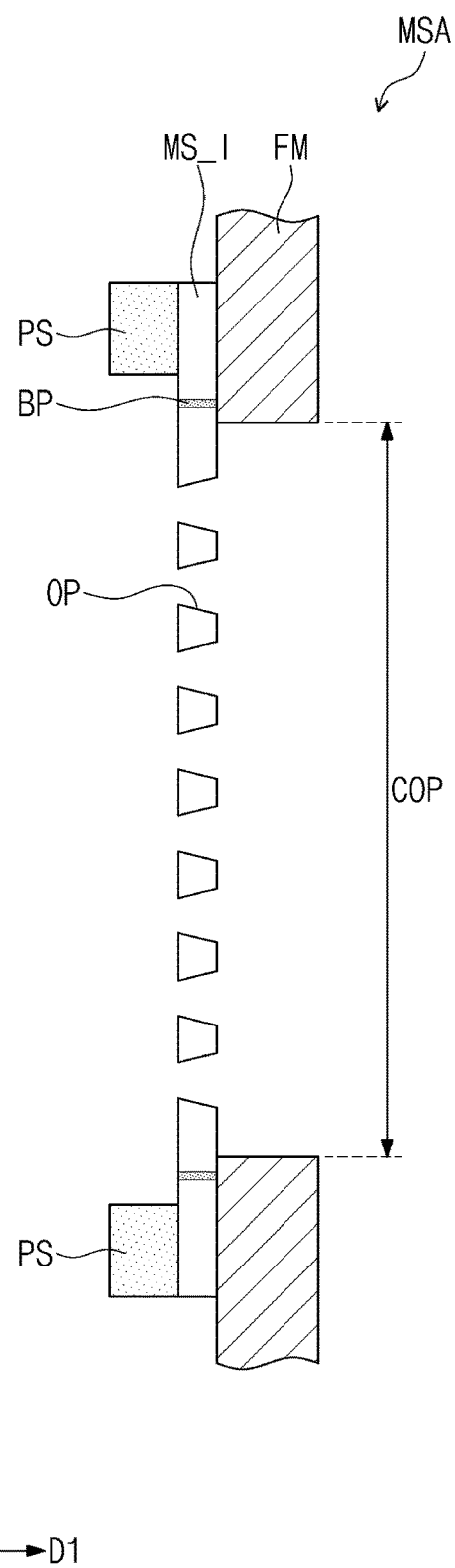

As illustrated in FIGS. 5C and 5D, the initial unit mask MS_I is attached to the mask frame FM such as by using a bonding tool DV1. The bonding tool DV1 may be a welding tool or a laser oscillator. The bonding tool DV1 provides a first beam IJ1 to the initial unit mask MS_I along a bonding line BL. The bonding line BL may be defined corresponding to a position of the mask frame FM which is at a periphery of the cell opening COP and outside the cell opening COP. The method may include providing of the initial mask assembly MSA including the mask frame FM in the attachment orientation thereof and having the initial deposition mask (e.g., initial unit mask MS_I) attached to the front surface SF of the mask frame FM which extends along the direction of gravity.

The first beam IJ1 may be a thermic ray or a laser ray. A portion of the initial unit mask MS_I and/or the mask frame FM may be melted by the first beam IJ1 so that the initial unit mask MS_I and the mask frame FM are attached to each other at the bonding line BL. Attachment of the initial unit mask MS_I to the mask frame FM by melting of a portion of the initial unit mask MS_I and/or the mask frame FM defines a bonding portion BP (e.g., attachment area). The bonding portion BP may include a metallic oxide as a portion of the material of the initial unit mask MS_I. The bonding portion BP may be a direct bond between the initial unit mask MS_I and the mask frame FM. That is, the mask assembly may include the deposition mask (e.g., unit mask MS) attached to the front surface SF of the mask frame FM by a direct bond in which a portion of the initial deposition mask or a portion of the mask frame FM is melted.

Figure 5E:
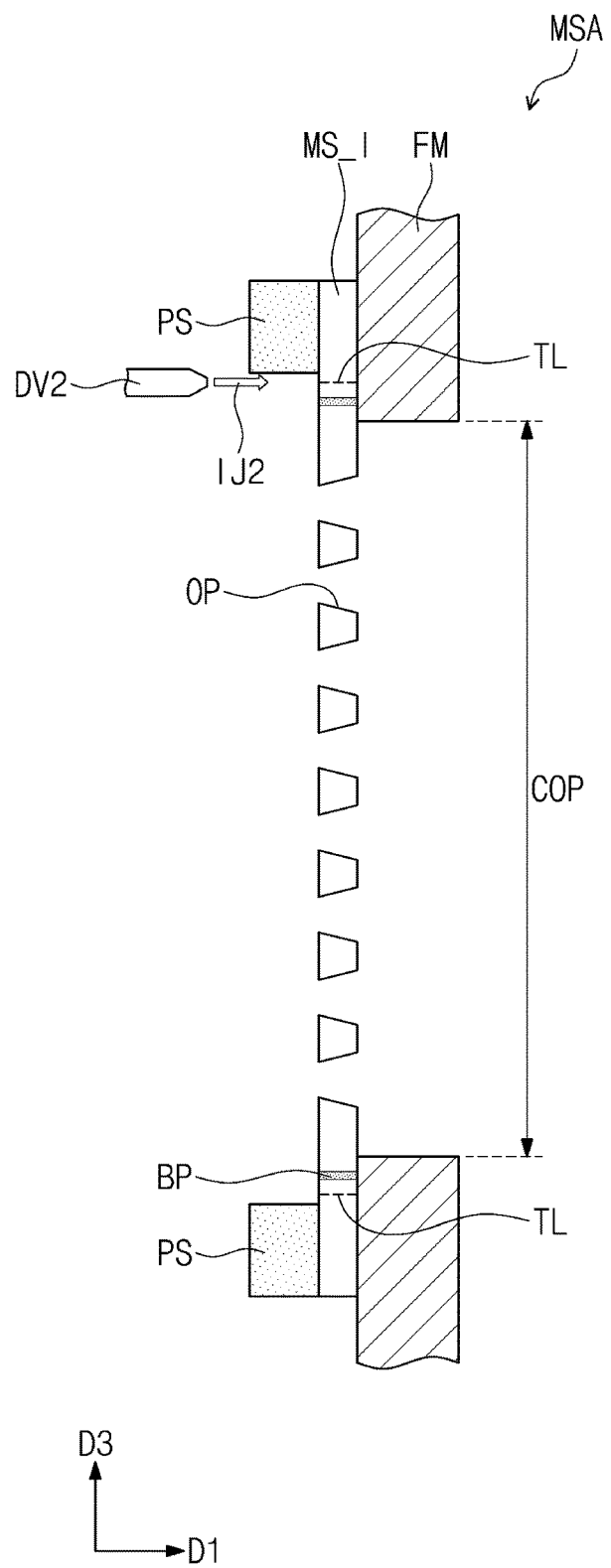
Figure 5F:
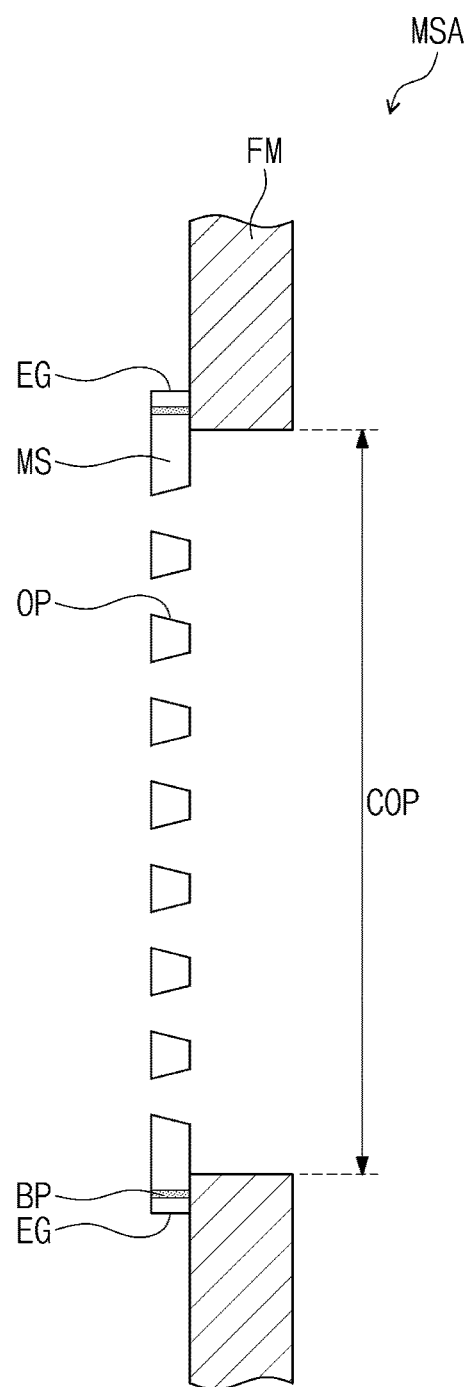

As illustrated in FIGS. 5E and 5F, the unit mask MS is provided by removing a portion of the initial unit mask MS_I from the initial mask assembly MSA. A cutting tool DV2 may be used to separate a portion of the initial unit mask MS_I from a remaining portion thereof. The portion of the initial unit mask MS_I is separated by irradiating a second beam IJ2 along a trimming line TL (e.g., separation line). The trimming line TL may be defined corresponding to a region between the bonding portion BP and a portion of the initial unit mask MS_I at which the porous chuck PS is contacted to the initial unit mask MS_I.

The remaining portion of the initial unit mask MS_I may provide a unit mask MS having an edge EG (e.g., outer edge). The trimming line TL of the initial unit mask MS_I may correspond to the edge EG of the unit mask MS as the remaining portion of the initial unit mask MS_I. That is, the method may further include providing a portion of the initial deposition mask separated from a remainder of the initial deposition mask of the initial mask assembly MSA, to provide a deposition mask of the mask assembly as the remainder of the initial deposition mask.

The cutting tool DV2 may include various tools which provide the second beam IJ2 to the initial unit mask MS_I. In an embodiment, for example, the cutting tool DV2 may include a heat irradiator, a light irradiator or a laser oscillator.

In an embodiment, the cutting tool DV2 may be a pulse laser oscillator and includes a picosecond or femtosecond pulse laser oscillator. Accordingly, the second beam IJ2 may be a pulse laser beam.

Referring to FIGS. 5A through 5F, an embodiment of a mask assembly includes a mask frame FM in which a first opening (e.g., cell opening COP) is defined, the mask frame FM including a front surface SF through which the first opening extends, and a deposition mask (e.g., unit mask MS) which is attached to the front surface SF of the mask frame FM and through which a plurality of second openings (e.g., openings OP) is defined. The mask frame FM includes an attachment orientation in which the front surface SF extends along a direction of gravity (e.g., third direction D3). The deposition mask includes an initial mask (e.g., initial unit mask MS_I) which is attached to the front surface SF of the mask frame FM in the attachment orientation thereof (e.g., while the mask frame FM is vertical along the third direction D3) and through which the plurality of second openings is defined. The attachment orientation of the mask frame FM having the front surface SF which extends along the direction of gravity disposes the first opening of the mask frame FM corresponding to all of the plurality of second openings of the initial mask along the direction of gravity.

According to one or more embodiment, by irradiating a fine pulse laser with the second beam IJ2 to separate a portion of the initial unit mask MS_I from a remaining portion thereof, a burr that may occur in the initial unit mask MS_I and/or deformation of the initial unit mask MS_I may be minimized. Minimizing of a burr and/or deformation of the unit mask MS provided from the initial unit mask MS_I minimizes a gap between the unit mask MS and the work substrate WS (see FIG. 2) which is in contact with the unit mask MS. As such, a process error rate in providing a deposition pattern by a deposition process using the unit mask MS may be lowered. In addition, damage to the work substrate WS which may be caused by contact with the mask MSK may be reduced or effectively prevented.

The second beam IJ2 may have a wavelength band. A wavelength band of the second beam IJ2 may be variously designed without being limited. In an embodiment, for example, when the wavelength band of the second beam IJ2 is about 500 nanometers (nm), the cutting efficiency of the initial unit mask MS_I including an Invar material may be relatively high.

In an embodiment, a scanner may be disposed between the cutting tool DV2 and the initial unit mask MS_I. The second beam IJ2, which passes through the scanner, may be irradiated onto each of the two trimming lines spaced apart from each other along the third direction D3 at the same time. Accordingly, the cutting time of the initial unit mask MS_I may be shortened. The scanner may be provided in singular or plural, and is not limited to any one embodiment.

Figure 6A:
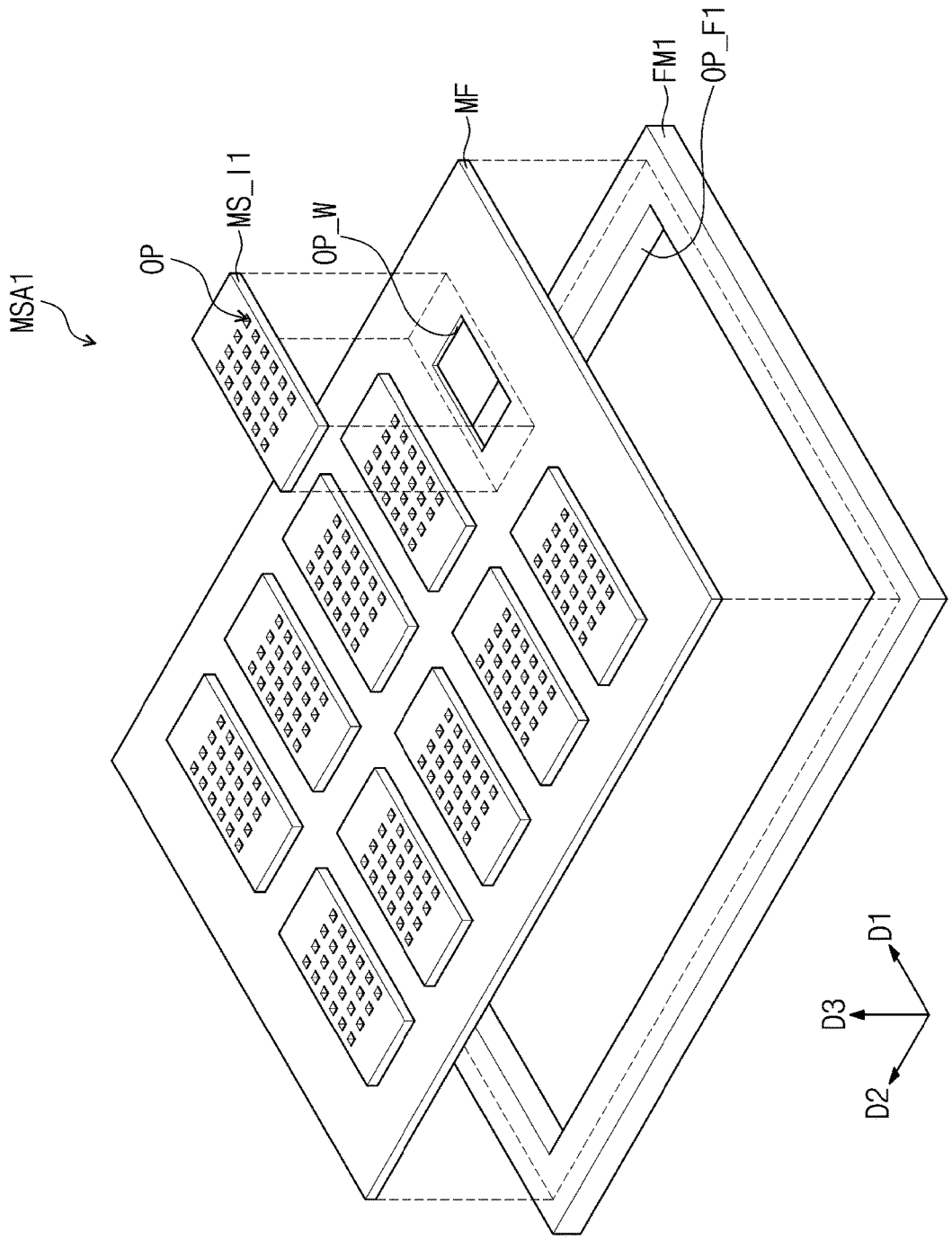
FIGS. 6A and 6B illustrate an embodiment of a mask assembly.
Figure 6B:
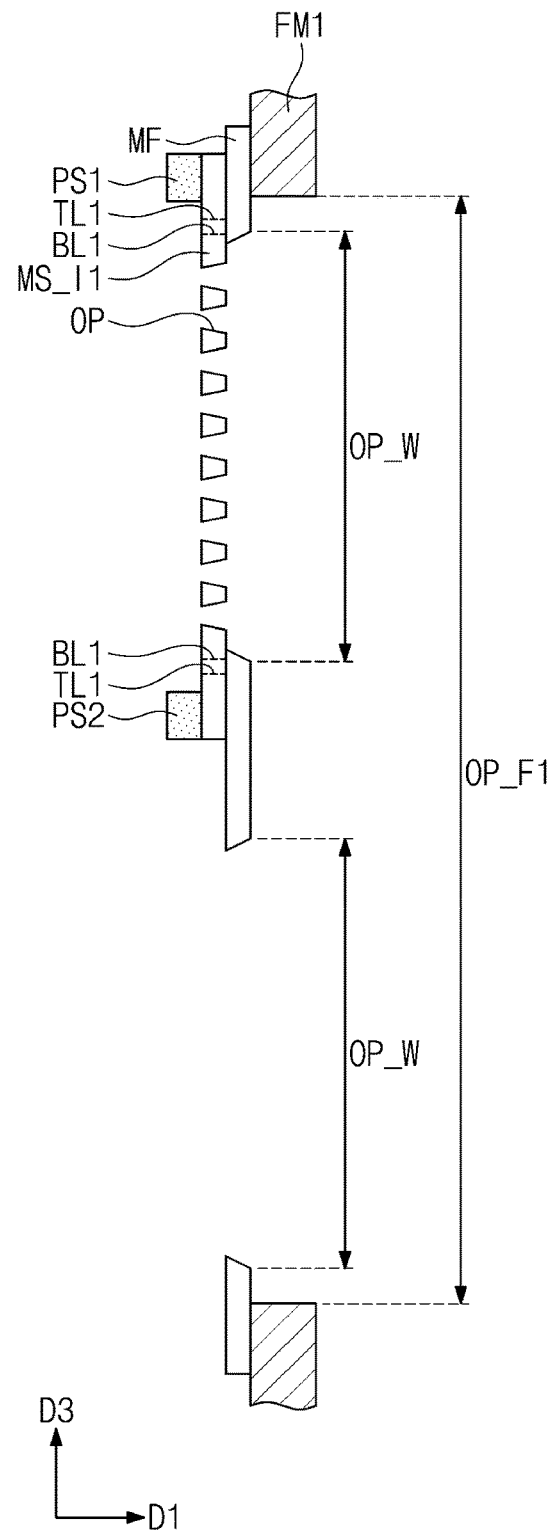

FIGS. 6A and 6B illustrate an embodiment of a first initial mask assembly MSA1. FIG. 6A illustrates an embodiment of the first initial mask assembly MSA1 which is horizontal, and FIG. 6B illustrates an embodiment of the first initial mask assembly MSA1 which is upright. The orientation illustrated in FIG. 6B may correspond to the orientation illustrated in FIG. 5B.

As illustrated in FIG. 6A, the first initial mask assembly MSA1 may include a first mask frame FM1, a middle frame MF, and a first initial unit mask MS_I1 provided in plural including a plurality of first initial unit masks MS_I1. The initial mask assembly structure may mean a structure of an assembly in which the initial mask and a frame are in contact with each other.

A mask opening OP_F1 may be defined in the first mask frame FM1. The first mask frame FM1 has a closed loop shape which defines the first opening (e.g., mask opening OP_F1) of the first mask frame FM1. Since the first mask frame FM1 has only one of the mask opening OP_F1 defined therein unlike the mask frame FM (see FIG. 3A) illustrated in FIG. 3A, the process of providing the first mask frame FM1 may be simplified.

The middle frame MF is disposed between the first initial unit masks MS_I1 and the first mask frame FM1 along the third direction D3. The middle frame MF may include a middle frame opening OP_W (e.g., third opening or third deposition opening) provided in plural including a plurality of middle frame openings OP_W. The middle frame openings OP_W may correspond to the plurality of openings OP and the cell opening COP illustrated in FIG. 3B.

The first initial unit masks MS_I1 are disposed facing the first mask frame FM1 with the middle frame MF therebetween. The first initial unit masks MS_I1 may be disposed respectively corresponding to the middle frame openings OP_W. In one or more embodiment, a planar shape of the mask opening OP_F1 of the first mask frame FM1 may be simplified by further including the middle frame MF. The middle frame MF and/or the first initial unit masks MS_I1 may be provided with a relatively small thickness when compared with the first mask frame FM1. According to one or more embodiment, the planar shape of the first mask frame FM1 having a relatively large thickness may be simplified by providing a plurality of middle frame openings OP_W in the middle frame MF with relatively easy processability.

Referring to FIG. 6B, the middle frame MF is disposed on and facing the front surface SF of the first mask frame FM1, and the first initial unit mask MS_I1 is disposed on an initial mask front surface. The first initial unit mask MS_I1 is coupled to the porous chucks PS1 and PS2 and provided to contact the middle frame MF. In an embodiment, the attachment orientation of the first mask frame FM1 having the front surface SF which extends along the direction of gravity disposes the first opening (e.g., mask opening OP_F1) of the first mask frame FM1 corresponding to all of the plurality of deposition masks (e.g., respectively including the first initial unit mask MS_I1) along the direction of gravity. The attachment orientation of the first mask frame FM1 having the front surface SF which extends along the direction of gravity disposes the first opening of the first mask frame FM1 further corresponding to all of the plurality of third openings (e.g., middle frame openings OP_W) of the middle frame MF along the direction of gravity.

With the first initial unit mask MS_I1 in contact with the middle frame MF, the first bonding line BL1 and the first trimming line TL1 may be defined at opposing sides of the first initial unit mask MS_I1 at which the porous chucks PS1 and PS2 are respectively attached, with the openings OP therebetween. Afterward, the middle frame MF and the first initial unit mask MS_I1 are combined to each other at the first bonding line BL1 such as by welding and the like. The first initial unit mask MS_I1 and the middle frame MF may be further attached to the first mask frame FM1 at the first bonding line BL1 without being limited thereto. Portions of the middle frame MF and the first initial unit mask MS_I1 may be separated from remaining portions thereof, such as by cutting along the first trimming line TL1, while the first initial unit mask MS_I1 remains attached to and supported by the porous chucks PS1 and PS2 until the first initial unit mask MS_I1 is finally provided. Accordingly, sagging of the first initial unit mask MS_I1 by gravity during a mask assembly manufacturing process may be reduced or effectively prevented.

In one or more embodiment, since the first initial mask assembly MSA1 may be provided in a vertical state (e.g., upright position), separate support sticks for supporting the first initial unit masks MS_I1 which are coupled to the first mask frame FM1 to prevent the first initial unit masks MS_I1 from sagging caused by gravity, may be omitted. Accordingly, the process may be simplified and the process costs may be reduced.

Figure 7A:
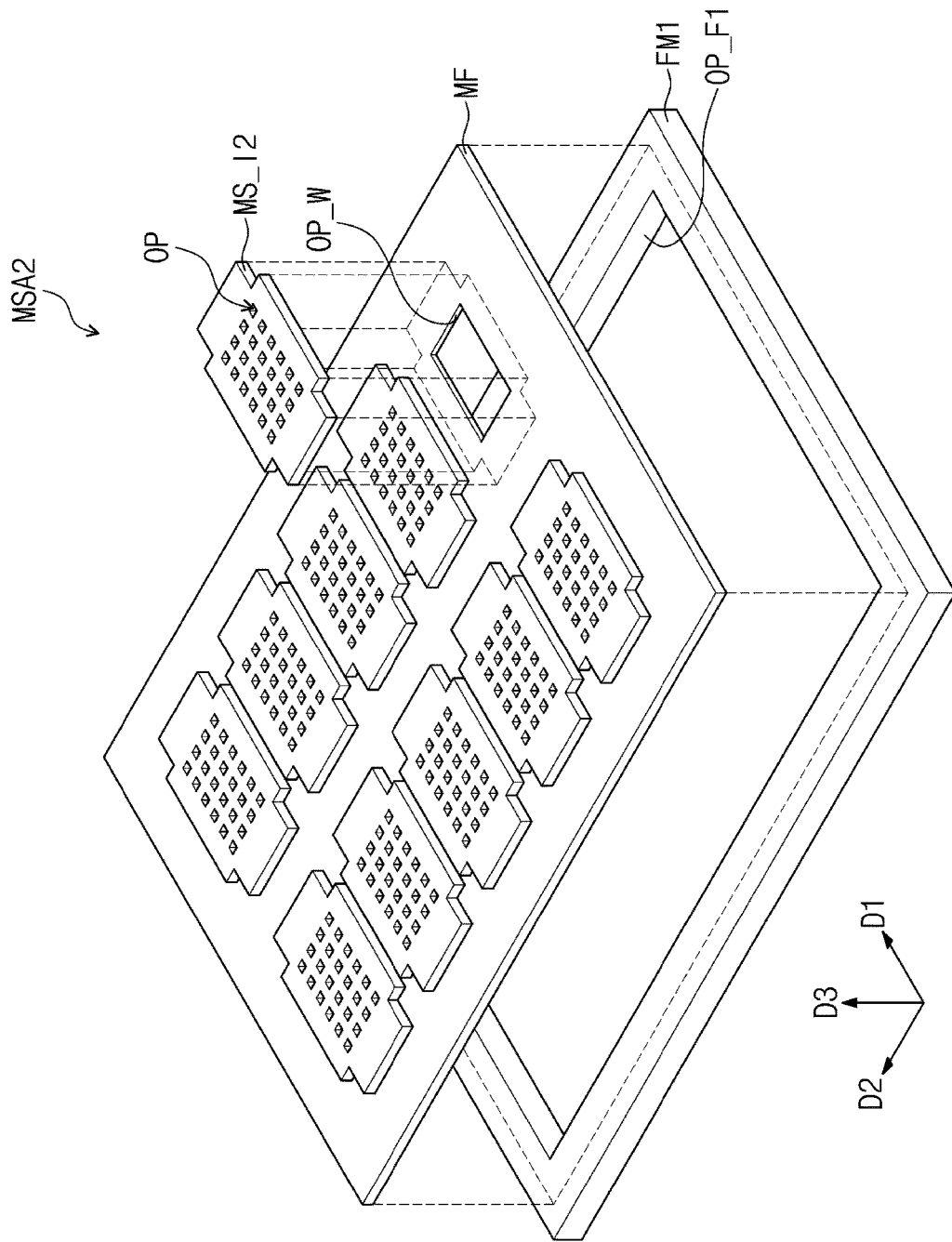
FIGS. 7A and 7B illustrate an embodiment of a mask assembly.
Figure 7B:
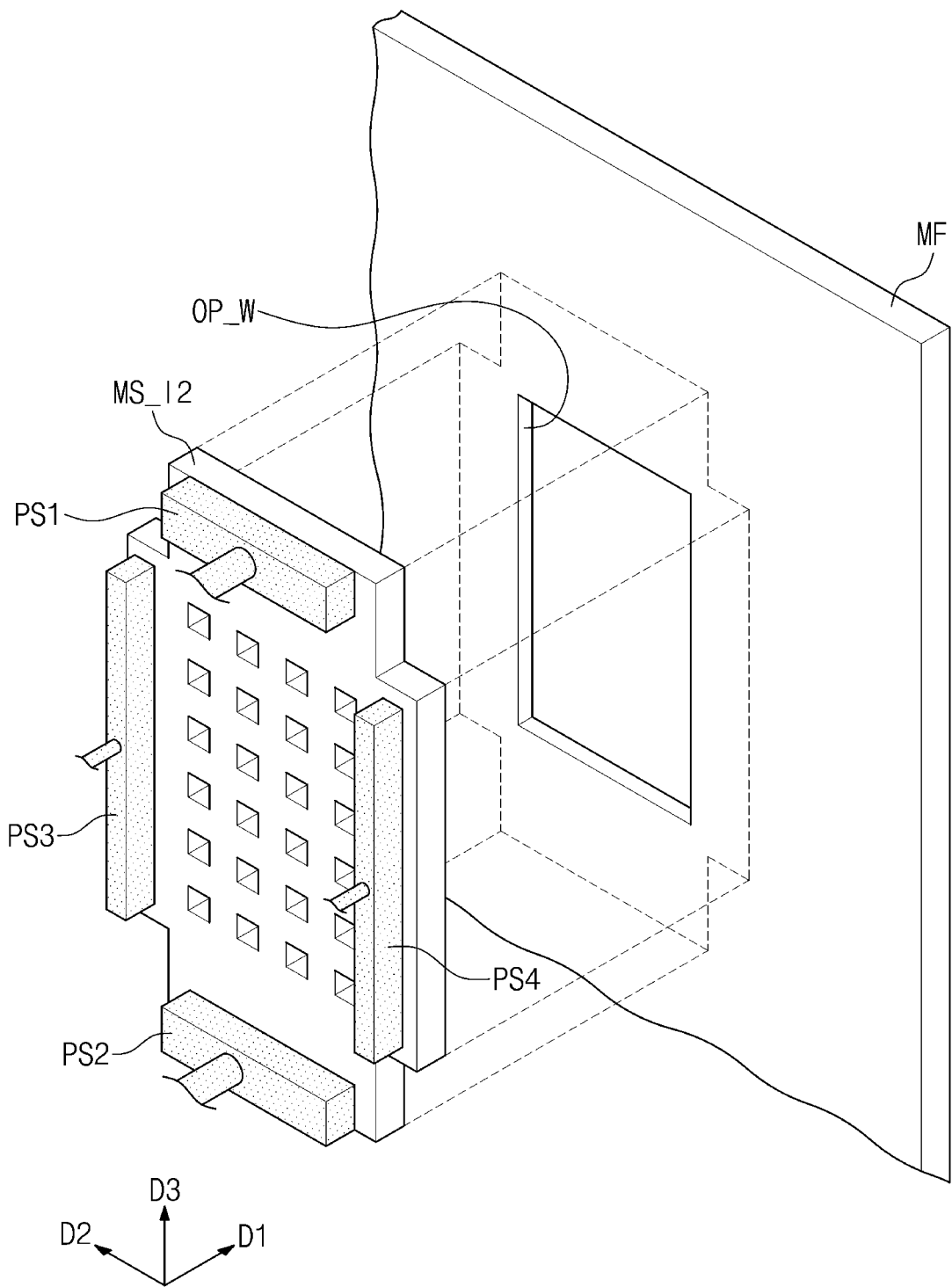

FIGS. 7A and 7B illustrate an embodiment of a second initial mask assembly MSA2. FIG. 7A illustrates the second initial mask assembly MSA2 which is horizontal and FIG. 7B illustrates an embodiment of the second initial mask assembly MSA2 which is upright. The orientation illustrated in FIG. 7B may correspond to the orientation FIG. 5B.

As illustrated in FIG. 7A, a second initial unit mask MS_I2 may a tension portion provided in plural such as including four tension parts. The second initial unit mask MS_I2 includes the tension parts protruded along the first direction D1 and the second direction D2 with respect to the openings OP. A planar including all of the openings OP may define a deposition area of the second initial unit mask MS_I2, and the tension portion may be extended from the deposition area to define an extended portion of the second initial unit mask MS_I2. That is, the tension portion of the second initial unit mask MS_I2 may extend further than a planar area of the deposition area. The tension parts may be portions of the second initial unit mask MS_I2 at which the second initial unit mask MS_I2 is attached to the middle frame MF.

As illustrated in FIG. 7B, the tension parts are disposed at the edge of the middle frame opening OP_W of the middle frame MF. The tension parts are respectively held by four porous chucks PS1, PS2, PS3 and PS4 and may be moved toward the middle frame MF. According to one or more embodiment, the mask assembly manufacturing process may be stably carried out due to the tension parts included and support by the porous chucks PS1, PS2, PS3 and PS4 at the tension parts of the second initial unit mask MS_I2.

Since the second initial mask assembly MSA2 may be manufactured in a vertical orientation, separate support sticks, which are coupled to the first mask frame FM1 to reduce or effectively prevent the second initial unit masks MS_I2 from sagging caused by gravity, may be omitted. Accordingly, the process may be simplified and the process costs may be reduced.

Figure 8A:
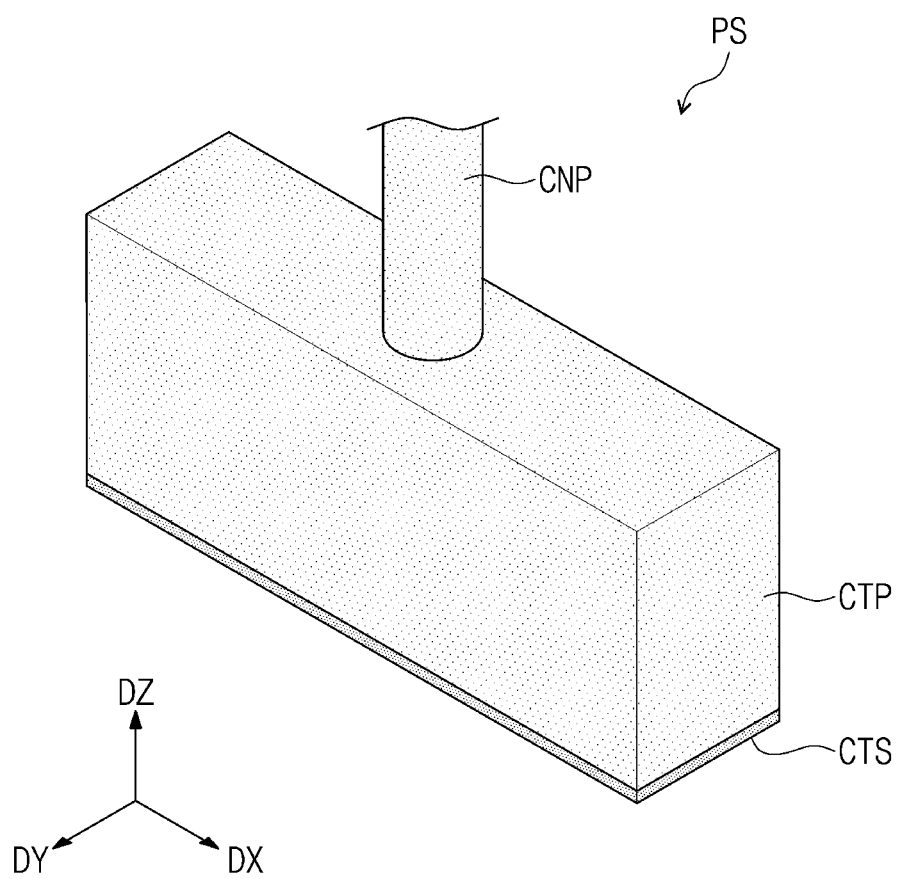
FIGS. 8A to 8C illustrate an embodiment of a porous chuck.
Figure 8B:
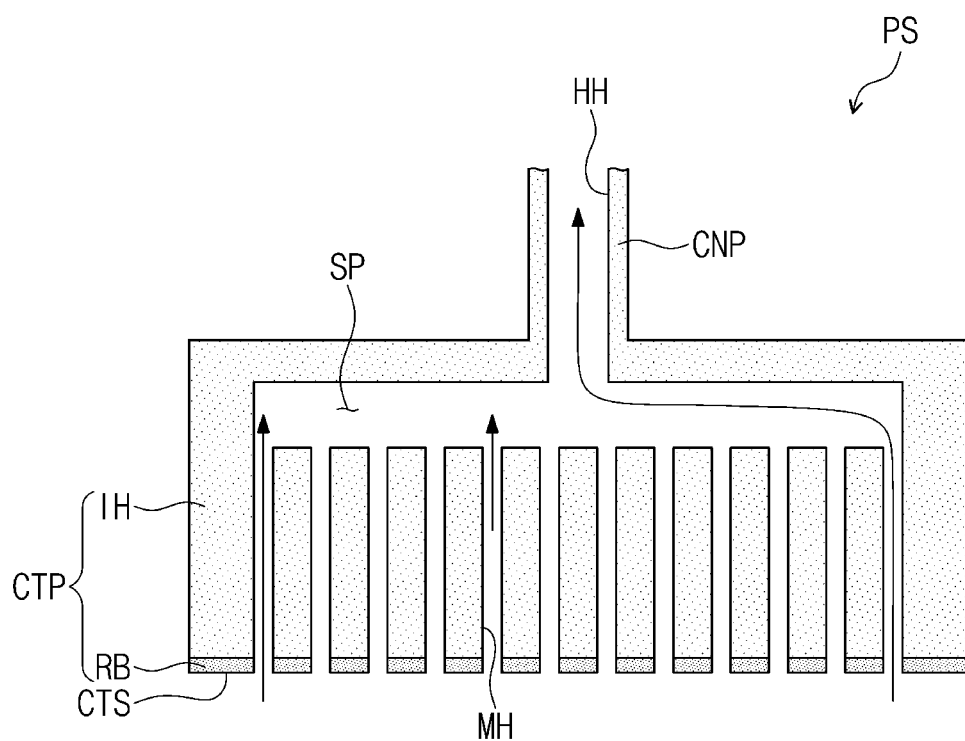
Figure 8C:
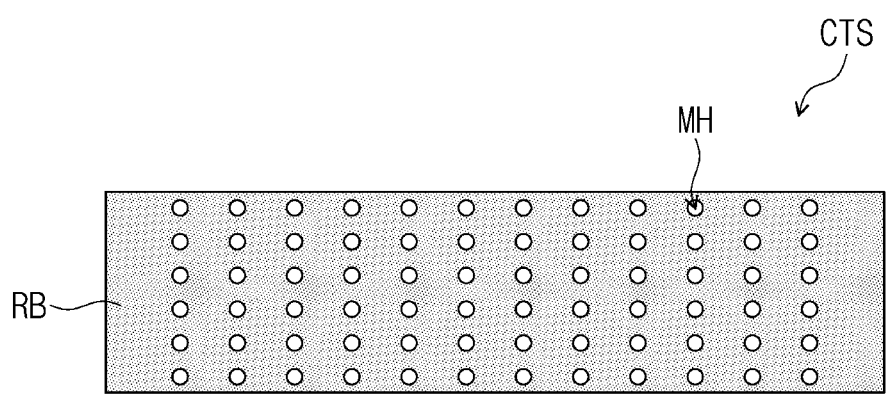

FIGS. 8A to 8C illustrate an embodiment of a porous chuck PS. FIG. 8A is a perspective view illustrating the porous chuck PS, FIG. 8B is a cross-sectional view illustrating the porous chuck PS and FIG. 8C is a bottom view illustrating the porous chuck PS.

As illustrated in FIG. 8A, the porous chuck PS may include a coupling portion CTP and a connecting portion CNP. The coupling portion CTP is a portion to which an initial mask is removably attached and which provides a contact surface CTS which is contacted by the initial mask which is attached to the porous chuck PS at a bottom surface thereof. The connecting portion CNP is connected to the coupling portion CTP and is movable in the X direction DX, in the Y direction DY and in the Z direction DZ. The coupling portion CTP is movable together with the connecting portion CNP.

As illustrated in FIGS. 8B and 8C, the coupling portion CTP may include a body member IH and a contact portion RB (e.g., contact layer). Portions of the body member IH provide a fine hole MH provided in plural including a plurality of fine holes MH and an inner space SP. The inner space SP may be connected to a hole HH in the connecting portion CNP. When a vacuum is created by a controller (not illustrated), the air outside the porous chuck PS flows into the porous chuck PS through the fine hole MH (e.g., input hole) and moves to the hole HH (e.g., output hole) of the connecting portion CNP through the inner space SP. Accordingly, the porous chuck PS applying a vacuum disposes the initial mask attached to the contact surface CTS.

The porous chuck PS may further include the contact portion RB. The contact portion RB may include holes respectively corresponding to fine holes MH. The contact surface CTS of the porous chuck PS may be substantially provided or defined by the contact portion RB. The contact portion RB may include or be formed of a material having ductility. In an embodiment, for example, the contact portion RB may include a polymer, a rubber or the like. Accordingly, physical damage to the initial mask which is in contact with the contact surface CTS may be reduced or effectively prevented.

According to one or more embodiment, when manufacturing a large-area mask assembly including a cell-based unit mask, sagging by gravity of the cell-based unit mask is reduced or effectively prevented. Accordingly, the reliability of a mask manufacturing process may be improved, and it is possible to provide the large-area mask assembly of high quality. In addition, according to one or more embodiment, a separate support to minimize sagging of the cell-based unit mask may be omitted. Accordingly, the costs for the mask manufacturing process may be reduced.

Although the above has been described with reference to embodiments, those skilled in the art or those of ordinary skill in the art will understand that various modifications and changes can be made within the scope that does not depart from the spirit and technical field of the invention described in the claims to be described.

Accordingly, the technical scope of the invention should not be limited to the content described in the detailed description of the specification, but should be determined by the claims as described.

What is claimed is:

1. A method for manufacturing a display panel, the method comprising:
   providing a mask assembly on a target substrate; and
   providing a light-emitting pattern of the display panel on the target substrate through the mask assembly,
   wherein the mask assembly comprises:
      a mask frame in which a first opening is defined extended through a front surface of the mask frame; and
      a deposition mask which is attached to the front surface of the mask frame and through which a second opening is defined corresponding to the light-emitting pattern of the display panel,
   wherein
   the mask frame includes an attachment orientation in which the front surface extends along a direction of gravity,
   the deposition mask includes an initial mask which is attached to the front surface of the mask frame in the attachment orientation thereof and through which the second opening is defined, and
   the attachment orientation of the mask frame having the front surface which extends along the direction of gravity disposes the first opening of the mask frame corresponding to the second opening of the initial mask along the direction of gravity.

2. The method of claim 1, wherein
   each of the first opening of the mask frame and the target substrate has a planar area, and
   the planar area of the first opening corresponds to the planar area of the target substrate.

3. The method of claim 1, further comprising:
   providing the light-emitting pattern in plural including a plurality of light-emitting patterns of a plurality of display panels respectively at target areas of the target substrate, and
   providing the plurality of display panels separated from each other,
   wherein
   the mask frame further comprises the first opening provided in plural including a plurality of first openings corresponding to the plurality of display panels, respectively; and
   the attachment orientation of the mask frame having the front surface which extends along the direction of gravity disposes the plurality of first openings of the mask frame respectively corresponding to the target areas of the target substrate along the direction of gravity.

4. The method of claim 1, wherein the mask assembly further comprises a middle frame between the mask frame and the initial mask and in which a third opening is defined, and the attachment orientation of the mask frame having the front surface which extends along the direction of gravity disposes the first opening of the mask frame corresponding to the third opening in the middle frame along the direction of gravity.

5. The method of claim 1, wherein the mask assembly further comprises the deposition mask attached to the front surface of the mask frame by a direct bond in which a portion of the deposition mask or a portion of the mask frame is melted.

6. The method of claim 1, wherein the mask frame has a closed loop shape which defines the first opening of the mask frame.

* * * * *